United States Patent [19]

Sallo

[11] Patent Number: 4,863,808

[45] Date of Patent: Sep. 5, 1989

[54] COPPER-CHROMIUM-POLYIMIDE COMPOSITE

[75] Inventor: Jerome S. Sallo, Northridge, Calif.

[73] Assignee: Gould Inc., Rolling Meadows, Ill.

[21] Appl. No.: 209,069

[22] Filed: Jun. 20, 1988

Related U.S. Application Data

[63] Continuation of Ser. No. 111,092, Oct. 16, 1987, abandoned, which is a continuation of Ser. No. 775,918, Sep. 13, 1985, abandoned.

[51] Int. Cl.⁴ .............................................. B32B 15/08
[52] U.S. Cl. .................................. 428/601; 428/626; 428/666; 428/674; 428/935; 428/938; 204/38.4
[58] Field of Search ............... 428/626, 601, 620, 666, 428/674, 675, 607, 671, 647, 938, 935; 204/38.4, 30, 20

[56] References Cited

U.S. PATENT DOCUMENTS

| | | | |
|---|---|---|---|
| 3,360,349 | 12/1967 | Adomines | 428/675 |
| 3,729,814 | 5/1973 | Wright et al. | 29/577 |
| 3,781,596 | 12/1973 | Galli | 174/68.5 |
| 3,981,691 | 9/1976 | Cuneo | 29/195 |
| 4,101,402 | 7/1978 | Vosson et al. | 428/675 |
| 4,193,849 | 3/1980 | Sato | 204/38.4 |
| 4,231,848 | 11/1980 | Kawasumi et al. | 204/38.4 |
| 4,395,313 | 7/1983 | Lindsay et al. | 204/38.4 |
| 4,568,413 | 2/1986 | Toth et al. | 204/38.4 |
| 4,585,901 | 4/1986 | Miller | 428/626 |

FOREIGN PATENT DOCUMENTS

| | | | |
|---|---|---|---|
| 18356 | 4/1982 | Japan | 204/35.1 |
| 145997 | 9/1982 | Japan | 204/38.4 |

*Primary Examiner*—John J. Zimmerman
*Attorney, Agent, or Firm*—Marshall, O'Toole, Gerstein, Murray & Bicknell

[57] ABSTRACT

A carrier for use in flexible circuits and tape-automated-bonding includes a layer of vacuum deposited metallic chromium between the copper and polyimide. The chromium is vacuum deposited on the polyimide, affords resistance to undercutting from gold and tin plating baths, and allows conductor to be deposited on both sides of the polyimide.

17 Claims, 1 Drawing Sheet

COPPER-CHROMIUM-POLYIMIDE COMPOSITE

This application is a continuation of application Ser. No. 111,092, filed Oct. 16, 1987 now abandoned, which is a continuation of application Ser. No. 775,918, filed Sept. 13, 1985, now abandoned.

BACKGROUND OF THE INVENTION

This invention relates generally to metal-clad dielectric sheeting for use in manufacturing flexible electric circuitry, and more particularly to copper-clad polyimide having an improved resistance to undercutting from gold or tin plating baths. Metal-clad dielectric sheeting is especially useful in beam tape carrier technology for automated bonding of semiconductor chips to substrates and for flexible printed circuit boards. A typical beam tape carrier consists of a dielectric (such as polyimide) with metal-cladding (such as copper), the metal-cladding being etched to leave a series of free standing beams which are directly bonded to semiconductor chips. One of the preferred metallurgies for the bonding process requires that copper beams be gold or tin plated. However, gold and tin plating baths cause undercutting at the edges of the copper beams and sometimes complete delamination of the beams from the dielectric sheeting.

Various coatings and other treatments for copper foils have been proposed to prevent undercutting and delamination of the copper foil and the dielectric layer. Indeed, a three-layer tape product consists of copper foil bonded to polyimide with an epoxy or acrylic adhesive. The three-layer product has no undercutting when gold plated because there is no exposed copper-polyimide surface. Two-layer product has a number of advantages in flexible circuitry over three-layer product and among those are added flexibility, less weight, lack of contamination due to the adhesive materials, potentially better thermal stability due to the thermal breakdown of the adhesive layer, the ability to expose the copper through the dielectric by chemically etching the dielectric, and stability to radiation. The adhesive material also affects sonic transmission when transducers are part of the circuit.

U.S. Pat. No. 3,981,691 to Cuneo teaches a method of improving the bond between the copper and the dielectric and which also minimizes undercutting by hydrochloric acid on the copper-polyimide bond. In Cuneo, black chromium (chrome oxide containing at least 25 weight-percent oxygen) is electrodeposited on the metal layer, followed by casting of the dielectric layer onto the black chrome covered metal layer. The Cuneo patent indicates that the copperpolyimide bond is improved such that the metal conductors will not be delaminated from the polyimide later by exposure for five minutes in a 10-normal hydrochloric bath at 25 degrees Celsius. While the black chrome treatment improves resistance to undercutting over the polyimide cast directly onto copper, the black chrome layer does not entirely prevent undercutting and delamination. Furthermore, since black chrome cannot be electrodeposited on polyimide, the Cuneo method is only available to cast polyimide films; i.e. in lieu there of polyimide films that are produced by pouring liquid polyimide onto the metal layer. This limits the Cuneo method to copper on one side of the polyimide film and to flexible circuit applications having relatively thin layers of polyimide. Also, the Cuneo method cannot be used with biaxially oriented polyimide such as Du Pont's kapton (Kapton is the Du Pont trademark for their polyimide film) because the Kapton is precast and cannot be bonded to the metal without an adhesive. (Kapton is biaxially oriented during fabrication and thus has good dimensional stability and is available in thicknesses up to 5 mils.) Dimensionally stable polyimide films such as Kapton are much preferred in flexible printed circuit applications over the cast polyimide.

U.S. Pat. No. 3,781,596 to Galli, et al. suggests plating a layer of chromium or nickel onto the copper layer to promote adhesion to the polyimide layer that is subsequently cast or laminated onto the copper layer. This method has the same disadvantages as Cuneo in that the chromium or nickel is plated on the copper, not the polyimide, thus limiting the product to conductor on one side of the polyimide, and is also limited to cast polyimide films. Furthermore, Cuneo indicates at (column 1, lines 35–49) that the chromium or nickel layer of Galli does not prevent undercutting when the product is placed in a gold plating bath.

U.S. Pat. No. 3,729,814 to Wright, et al. describes a method for making hybrid circuit arrays using a thin flexible substrate such as polyimide, vapor depositing a layer of chromium or nichrome onto the substrate, followed by vapor depositing a gold layer on the chrome or nichrome layer. The gold layer is then etched to form resistors, conductors, chip mounting pads and interconnections. While Wright teaches a method of improving adhesion of gold to polyimide, Wright does not address the problem of undercutting the copper-polyimide boundary caused by gold and tin plating baths. Indeed, Wright is not concerned with electrodeposition at all, his method uses vapor deposition to form the layers.

Therefore, it is an object of the present invention to provide a metal-clad dielectric which resists delamination and undercutting of the metal when exposed to certain plating baths.

It is another object of the present invention to provide an adhesiveless flexible carrier product having thicker and dimensionally stable polyimide layers.

It is also an object of the present invention to provide an adhesiveness flexible carrier product having a metal layer on each side of the polyimide film.

Additional objects, advantages, and novel features of the invention will be set forth in part in the description which follows and in part will become apparent to those skilled in the art upon examination of the following or may be learned by practice of the invention.

SUMMARY OF THE INVENTION

To achieve the foregoing and other objects and in accordance with the purposes of the present invention a flexible carrier may comprise a layer of dimensionally stable polyimide film; a layer of metallic chromium vapor-deposited on the polyimide; and a layer of copper electrodeposited on the chromium layer. The foregoing carrier has improved resistance to undercutting and delamination when immersed in a gold or tin plating bath. Since the chromium is deposited on the polyimide, conductors can be easily formed on both sides of the polyimide film.

While not wishing to limit himself to any particular theory of operation, the inventor believes that the improved bonding between the copper and polyimde afforded by the chromium is related to the fact that sputtering or vacuum deposition is a high energy process.

When a chromium target is bombarded with ions or electrons, metallic chromium atoms are dislodged at a high energy. These chromium atoms are then deposited on the polyimde layer in a high energy-type interaction. The inventor determined that there is something special about the high energy reaction between chromium and the polyimide as compared to casting the polyimide onto a chromium plated copper film. Sputtering copper directly onto polyimide did not result in any improvements in resistance to undercutting from a gold plating bath. The inventor believes that the reason chromium works where copper does not has to do with overvoltage and the liberation of hydrogen gas during the plating process. The polyimide film absorbs about 3% by weight of water. When the copper-polyimide film is placed into an aqueous plating solution, it acts like a sponge that absorbs the electrolyte and the electrolyte then attempts to plate gold (or tin) on the back side of the copper, causing the copper to delaminate from the polyimide film.

Because of this property of the polyimide, the plating is done under very unfavorable conditions since the plating surface is on the back side of the copper away from the anode. This is very inefficient and tends to liberate hydrogen gas and it is actually the hydrogen gas that causes the delamination of the copper from the polyimide film. Putting a metal such as chromium in between the copper and the polyimide forces the hydrogen to form on the chromium surface rather than the copper surface. There is a very high overvoltage on the chromium surface which does not allow the hydrogen gas to be liberated.

BRIEF DESCRIPTION OF THE DRAWINGS

The present invention is illustrated in the accompanying drawing wherein.

DETAILED DESCRIPTION OF THE INVENTION

Figure 1:
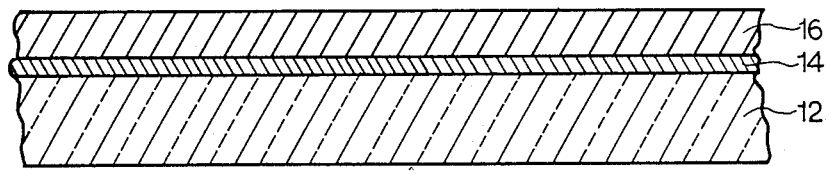
FIG. 1 is a schematic cross-section of a carrier including a layer of chromium deposited between the polyimide and copper layers.

A carrier which may be used as a flexible circuit or for bonding semiconductor chips to a substrate is manufactured in accordance with the following steps. A dimensionally stable (biaxially oriented) polyimide layer such as Kapton is obtained. The polyimide is typically available in ½ mil, 1 mil, 2 mil, 3 mil, and 5 mil thicknesses. For TAB (tape-automated-bonding) applications 2 mil or 3 mil polyimide is preferred. The polyimide layer must be very clean and free of dust prior to vacuum deposition of the chromium layer. Cleaning can be accomplished with various vacuum techniques such as corona discharge or plasma discharge.

The polyimide is then placed in a vacuum chamber with a chrome target. The chrome is sputtered using conventional techniques. In lieu of sputtering, evaporation or chemical deposition may also be used to deposit the chromium onto the polyimide. Preferably the chromium layer is deposited to have a thickness of from 50 to 500 Angstroms. Then the copper layer is electrodeposited onto the chromium layer to the desired thickness. Since it is sometimes difficult to electrodeposit copper directly onto the chromium, a thin layer of copper may be sputtered onto the chromium while the carrier is still in the vacuum chamber. Preferably the copper is sputtered onto the chromium to have a thickness of about 1000 Angstroms.

The plating is done from a plating baths such as copper sulfate or copper pyrophosphate under conventional conditions for the printed circuit industry: 25 degrees Celsius; in the neighborhood of 60 amps per square foot current density with agitation of the bath; using a filtered copper sulfate plating bath of controlled pH with the pH in the range of 2-4. The plating bath can also be a bath purchased from a commercial vendor and usually contains proprietary organic addition agents for either brightening or leveling of the deposit. Proprietary baths need not be used; a standard copper sulfate or pyrophosphate solution under the above conditions is adequate for the electrodeposition. Normally, a soluble copper anode and deionized water is used. The anodes are bagged with an inert cloth material. The copper layer is preferably electrodeposited to a thickness of 25 micrometers. Following the electrodeposition step, the carrier is processed for making circuitry or TAB. Typically, a dry film photoresist is laminated to the copper surface, the circuit pattern is imaged and then developed. This is followed by etching to remove the unwanted copper which has not been protected. Etching is accomplished in any of the standard etching solutions, such as ferric chloride, cupric chloride, alkaline etch, or hydrogen peroxide etchant. A very good fine line width is possible because it is possible to keep the deposited copper thickness very thin. In TAB it may be necessary to etch the polyimide. This is accomplished with a dry film resist and a very caustic, high-temperature etch. Once the desired copper beams have been formed, the composite is placed in a gold (or tin or solder) plating bath where the beams are electrodeposited with gold.

The foregoing method can be used to form a TAB product with copper beams on both sides of the polyimide by repeating the copper etching procedure for the second surface.

Figure 2:
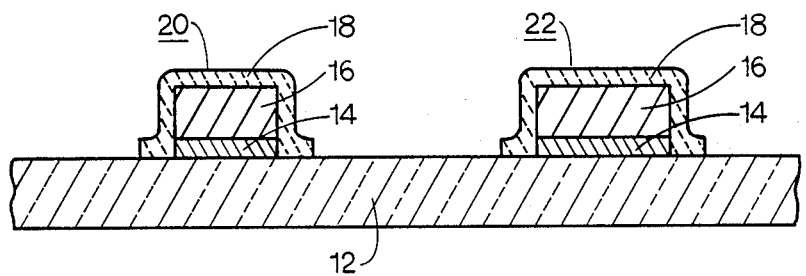
FIG. 2 is a schematic cross-section of a TAB product in which the etched copper beams have been plated with gold.

In FIG. 1 carrier 10 is shown with polyimide layer 12, sputtered chromium layer 14, and electrodeposited copper layer 16. In FIG. 2 carrier 10 has been etched to form two copper beams 20 and 22, which have subsequently been plated with gold 18.

The invention will be further illustrated by the following examples.

EXAMPLE 1

A composite consisting of Kapton with sputtered chrome and copper; the chrome being 50 angstroms thick and the copper being 1500 Angstroms thick, was plated with 25 microns of copper in the following plating bath:

Copper sulfate—10 oz./gal.
Sulfuric acid—25 oz./gal.
Chloride—75 PPM
Copper Gleam PC (from Lea Ronal)—0.5% by volume.

The bath was operated under the following conditions: room temperature, air agitation, cathode current density 20 amperes per square foot using coper anodes.

Following the plate-up a fine line circuit was etched in the copper using a ferric chloride etchant. The remaining thin layer of chromium was dissolved in 10% hydrochloric acid at room temperature.

The composite was then gold plated in the following plating bath:

the bath was type ECF-61 purchased from Englehard (containing proprietary additives)

bath had a metallic gold content of 1.2 Troy ozs. per gallon and was operated at a pH of 9.0 and 120° F.

the current density of 5 amperes per square foot was used.

the anodes were platenized titanium.

Following the electrodeposit of 100 microinches of gold, no undercut or delamination from the Kapton was observed.

EXAMPLE 2

A composite consisting of Kapton with 1500 Angstroms of copper directly deposited on the Kapton was used. The material was plated up to 1 mil of copper, printed and etched as described in Example 1. The part was then electroplated with gold as described in Example 1. Almost total delamination of the copper from the Kapton was observed.

EXAMPLE 3

A composite was copper plated, printed and etched exactly as described in Example 1. The composite was then electroless-tin plated in a type ST-240 plating bath obtained from Cutech. The Cutech bath contains 2½–3 ozs. per gallon of tin and is operated at a pH of 2.0 at room temperature. The pre-clean in Cutech HL-16 30% by weight in water was performed for 10 minutes. No delamination or undercutting of the copper from the Kapton was observed.

EXAMPLE 4

Sample was prepared exactly as in Example 2 and treated with Cutech tin exactly as described in Example 3. Almost total delamination of the copper from the Kapton was observed.

I claim:

1. A carrier comprising:
   a layer of dimensionally stable polyimide film;
   a layer of metallic chromium vapor-deposited on said polyimide;
   a layer of copper vapor-deposited on said chromium layer; and
   a layer of copper electrodeposited on said vapor-deposited copper layer.

2. The carrier of claim 1 wherein said chromium layer has a thickness of from 50 to 500 Angstroms.

3. The carrier of claim 2 wherein said electrodeposited copper layer has a thickness of about 25 micrometers.

4. The carrier of claim 1 further comprising a layer of gold plated on said electrodeposited copper layer.

5. The carrier of claim 1 further comprising a layer of tin or solder deposited on said electrodeposited copper layer.

6. The carrier of claim 1 wherein said electrodeposited copper layer forms a desired pattern of copper beams and further comprising a layer of gold plated on said copper beams.

7. The carrier of claim 1 wherein said electrodeposited copper layer forms a desired pattern of copper beams and further comprising a layer of tin or solder deposited on said copper beams.

8. The carrier of claim 1 wherein said vapor-deposited copper layer has a thickness of about 1000 Angstroms.

9. A carrier comprising:
   a layer of dimensionally stable polyimide film;
   a layer of metallic chromium vapor-deposited on each side of said polyimide layer;
   a layer of copper vapor-deposited on each of said chromium layers; and
   a layer of copper electrodeposited on each of said vapor-deposited copper layers.

10. The carrier of claim 9 wherein each chromium layer has a thickness of from 50 to 500 Angstroms.

11. The carrier of claim 10 wherein each electrodeposited copper layer has a thickness of about 25 micrometers.

12. The carrier of claim 9 further comprising a layer of gold plated on each of said electrodeposited copper layers.

13. The carrier of claim 9 wherein at least one of said electrodeposited copper layers forms a desired pattern of copper beams and further comprising a layer of gold plated on at least one of said electrodeposited copper layers and said copper beams.

14. A method of manufacturing a carrier having improved resistance to undercutting from gold or tin plating baths comprising the steps of:
   providing a dimensionally stable polyimide substrate;
   vapor depositing a layer of metallic chromium on said polyimide;
   vapor depositing a layer of copper onto said chromium layer; and
   electrodepositing a layer of copper on said vapor-deposited copper layer.

15. The method of claim 14 wherein said chromium layer has a thickness of from 50 to 500 Angstroms.

16. The method of claim 15 wherein said electrodeposited copper layer has a thickness of about 25 micrometers.

17. The method of claim 16 wherein said vapor deposited copper layer has a thickness of about 1000 Angstroms.

* * * * *